United States Patent [19]

Quinton et al.

[11] 4,257,853

[45] Mar. 24, 1981

[54] METAL PLATING PROCESS

[75] Inventors: Carrol D. Quinton, Lemont; Raphael Guio, Chicago, both of Ill.

[73] Assignee: Bunker Ramo Corporation, Oak Brook, Ill.

[21] Appl. No.: 949,305

[22] Filed: Oct. 6, 1978

[51] Int. Cl.³ .......................... C25D 5/34; C25D 5/48; C25D 17/16; C25D 17/28

[52] U.S. Cl. ............... 204/32 R; 204/35 R; 204/200; 204/201

[58] Field of Search .............. 204/23, 46 G, 32 R, 204/DIG. 9, 200, 201, 215, 35 R, 36

[56] References Cited

U.S. PATENT DOCUMENTS

| | | | |
|---|---|---|---|
| 838,717 | 12/1906 | Hutchinson | 204/46 G |
| 2,451,341 | 10/1948 | Jernstedt | 204/DIG. 9 |
| 2,678,909 | 5/1954 | Jernstedt | 204/46 G |
| 3,607,712 | 9/1971 | Barton | 204/201 |
| 3,855,107 | 12/1974 | McInnes | 204/201 |

OTHER PUBLICATIONS

*Modern Electroplating*, edited by Frederick Lowenheim, 1963, pp. 207–223, 545–555.
*IBM Technical Disclosure Bulletin*, vol. 16, No. 3, Aug. 1973, pp. 979, 980.

[57] ABSTRACT

A metal plating process and apparatus is disclosed and includes a plurality of pre-plating stations comprising tanks or reservoirs containing various cleaning and rinsing solutions. A pulse plating or gold flash station including a plating tank is provided after the pre-plating stations, and a plurality of post-plating stations or tanks are provided after the pulse-plating station. Rotatable barrels for containing work loads are carried along path of travel from station to station along the process. Differential speed mechanisms are provided along the process so that the work load containers rotate at a slower rate of rotation while traveling through air than while the containers are disposed within the various tanks or stations along the process. The pulse-plating of the work load at the plating station takes place in a chemical bath while rotating the work load within the bath, controlling the chemistry of the bath including the gold concentration, controlling the duty cycle of the pulse-plating operation, controlling the rotation of the work load within the bath, and controlling such other parameters as the bath temperature.

51 Claims, 4 Drawing Figures

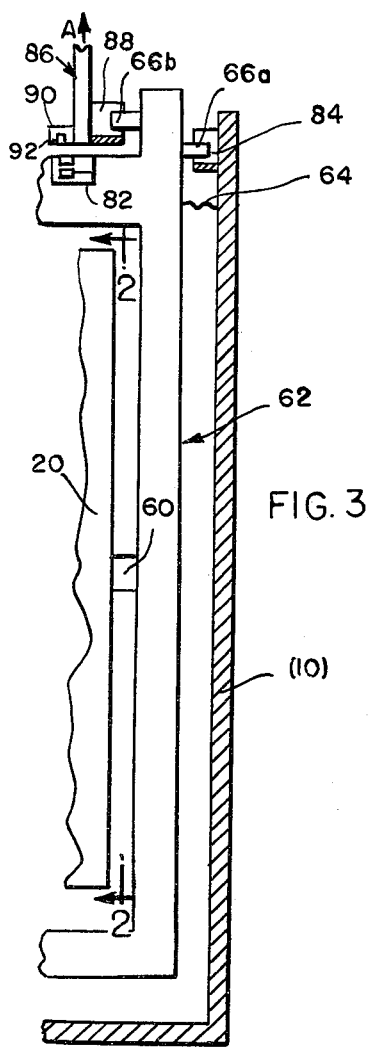
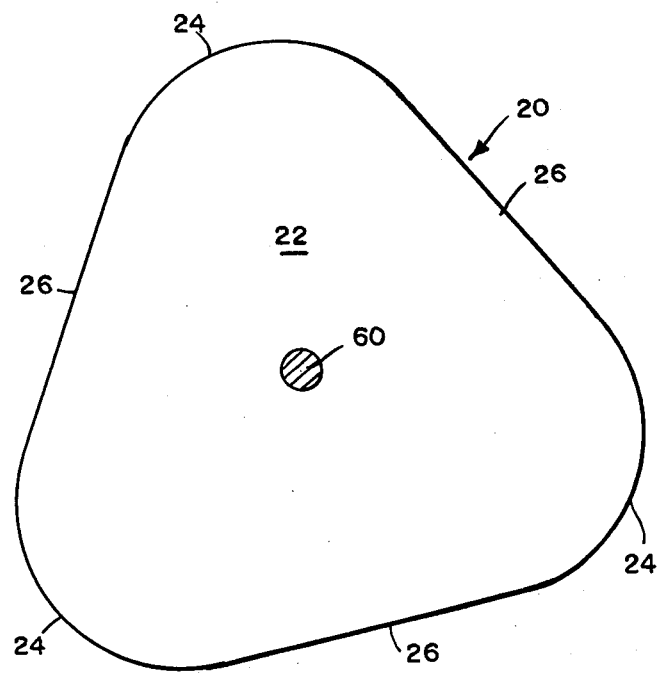
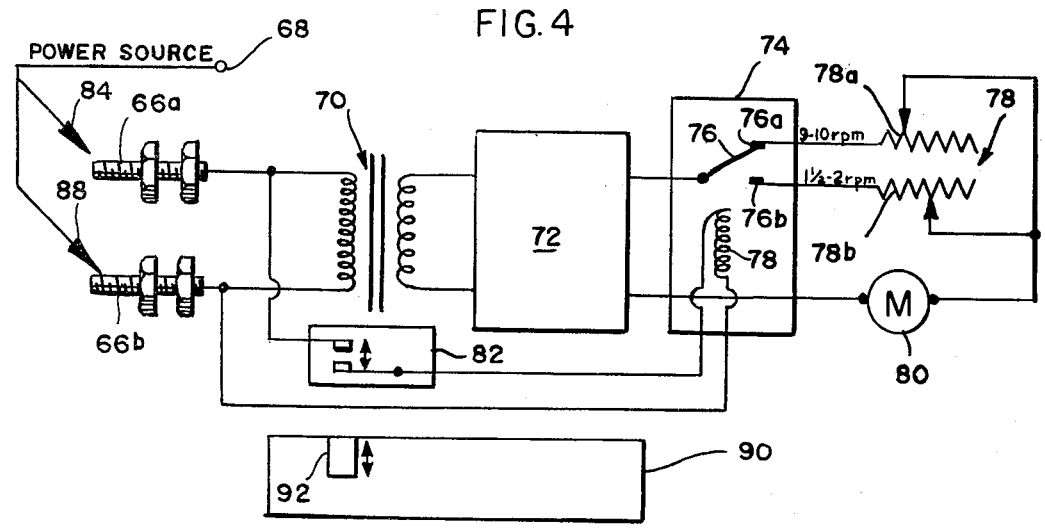

METAL PLATING PROCESS

BACKGROUND AND SUMMARY OF THE INVENTION

This invention relates to a metal plating process and apparatus which is shown with particular applicability to gold plating or flashing work loads such as electrical contacts.

It is desirable to gold plate electrical contacts for certain applications such as for use in telephone connectors, printed circuit boards, or the like, to provide a nontarnishing conductive finish on the contacts. The gold finish permits a simple wiping of such impurities as oxides from the contacts to clean the same and provide for quite sensitive mating or wiping surfaces for the contacts. Many such contacts are very small and fragile and may easily be damaged, such as by deformation during handling, which greatly increases the fail rate of the connectors with which the contacts are utilized. Furthermore, deformed contacts of this type cause a great deal of problems, such as machinery hangups and loss assembly time, when the contacts are assembled to the respective connectors with which they are to be used. One of the major areas resulting in deformation of the contacts during manufacture is during the gold plating process for the contacts. The contacts are normally carried in tumbler-type containers or barrels through various plating processes and the tumbling action of the contacts, in and of itself, often times results in damage to the contacts because the barrels desirably are rotated at a relatively high rate of rotation due to the actual plating operation of the process.

More particularly, during a plating operation, such as by pulse plating, controlled rotation of the contacts during the plating operation contributes to the production of uniformily and consistently plated work loads. As will be more apparent in the detailed description of the invention herein, it is desirable to control the work load rotation during the pulse-plating operation to a speed on the order of 9-10 rpm. However, this fast rate of rotation, while being very desirable during the pulse-plating operation, is undesirable while transporting the contacts within their tumbler-type barrels through the air from station to station. Such a high rate of rotation results in a high rate of contact deformation.

Therefore, one of the principal features of the invention is to provide a process and apparatus for metal plating a work load, such as gold plating electrical contacts, wherein the work load is carried in a tumbler-type container or barrel from station to station along the process, and a differential speed of rotation is provided for the barrels and work loads so that the barrels rotate at a slower rate of rotation in air than in solution.

It also is important to control the various parameters of the pulse-plating operation in conjunction with controlling the rate of rotation of the work loads. These parameters include controlling the chemistry of the bath including the gold concentration within the tank at the pulse-plating station, as well as the duty cycle of the pulse-plating operation, the temperature of the chemical bath, and the like.

In accordance with the invention disclosed herein, the Baumé of the chemical bath at the pulse-plating station is controlled on the order of 15°-17° specific gravity. The pH of the chemical bath is on the order of 3.7 or 3.8. The gold concentration of the chemical bath is on the order of 0.3 to 0.4 troy ounce gold per gallon of solution. The temperature of the chemical bath is on the order of 90°-95° F. The current density of the chemical bath at the pulse-plating station is on the order one ampere per square foot of work load to be plated. The duty cycle of the pulse-plating operation is on the order of one micro-second on and two micro-seconds off. As stated above, the rpm of the work load within the chemical bath is on the order of 9 or 10 rpm. By controlling these parameters, along with the distribution of the work load within the barrels, very uniform and consistent gold plating of the work load is obtained.

In the process of the present invention, various cascade-type rinse assemblies are utilized both before and after the gold plating station and other water and deionized water circulation means is provided and results in considerable savings in the total amount of solution required for the process. In addition, the gold residue in solution from a rinse tank or station following the gold plating station, is fed to a gold recovery station utilizing a vacuum distillation process. The distillate therefrom is returned to the solution in one of the cascade-type rinse tanks in the process, and the recovered gold is returned to the gold plating tank.

The electrical contacts, after they are rinsed following the gold plating operation, are dried in a low torque centrifugal dryer having a gradual start-up speed from zero to full rpm. Here again, the drying of electrical contacts of the character described herein, often times results in further contact deformation due to the high centrifugal forces involved. By using a low torque dryer which includes an eddy current control clutch drive motor, the contact deformation is greatly reduced.

Other objects, features and advantages of the invention will be apparent from the following detailed description taken in connection with the accompanying drawings.

DESCRIPTION OF THE DRAWINGS

FIG. 2 is an end elevational view looking generally in the direction of line 2—2 of FIG. 3 of a barrel-type container for carrying the work load of the present invention through the process illustrated in FIG. 1;

FIG. 3 is a fragmented side elevational view of one end of the barrel-type container shown in FIG. 1 in association with a portion of its carrying frame, a portion of a hoist mechanism for carrying the frame and container through the process shown in FIG. 1, and a portion of the plating tank (10) within which the container and frame is positionable; and FIG. 4 is a circuit diagram including the power means on the container frame, along with the switch actuating means on the hoist mechanism.

DETAILED DESCRIPTION OF THE INVENTION

Figure 1:
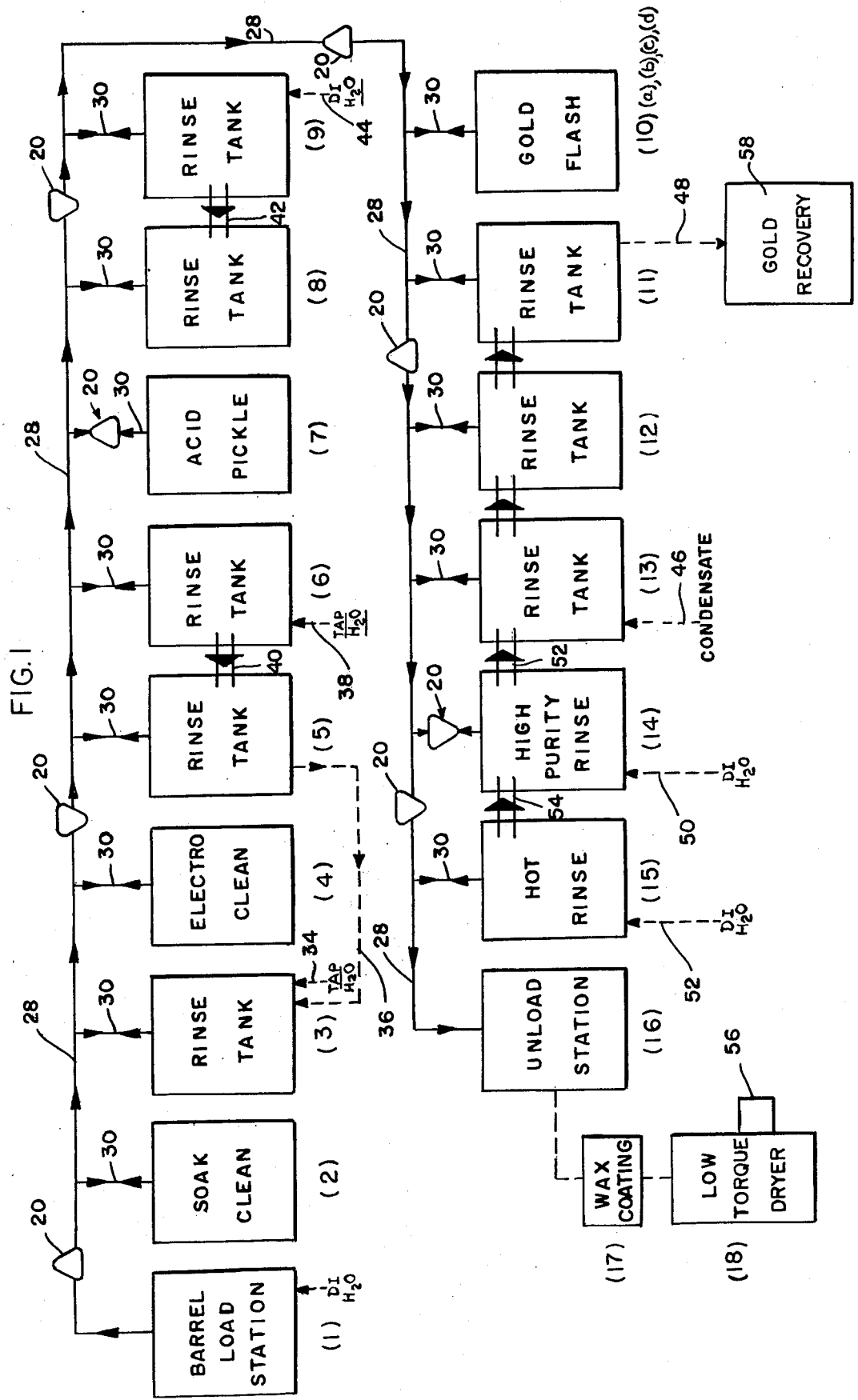
FIG. 1 is a block diagram of a metal plating process illustrating certain concepts of the present invention.

The metal plating process of the present invention is shown herein as embodied in a method for gold plating a work load such as electrical contacts or the like. However, it should be understood that various features of the process, as well as the apparatus shown herein, is intended to encompass other metal plating applications without departing from the spirit and the scope of the invention as disclosed and claimed herein.

Referring to the drawings in greater detail, and first to FIG. 2, the work load which is to be metal plated by the process of the present invention, such as a plurality of electrical contacts, is carried along a path of travel within a barrel-type container, generally designated 20. An end elevational view of the container or barrel is shown in FIG. 2. The barrel includes a pair of spaced, generally parallel end plates 22 between which an open mesh screen-type barrel (not shown) is disposed. The end plate 22 is shown in FIG. 2 so as to illustrate the cross sectional shape of the barrel. The cross sectional shape includes a plurality (three) parabolic sections 24 joined together by a plurality (three) flat sections 26 so as to form a joined "cloverleaf" cross sectional configuration. Although the barrel size could vary in accordance with the size and number of the work load contained therein, one type of barrel which has proven effected is Model 918A "Delta type" barrel manufactured by Sterling Systems Company.

The barrel 22 is rotated as it is moved along the path of travel (described hereinafter) in accordance with the flow path shown in FIG. 1. As the barrel rotates, the work load or electrical contacts contained therein tumble within the barrel in a controlled manner effected by the barrel configuration. The configuration effectively distributes the work load, which may comprise very small and relatively fragile electrical contacts, very evenly within the barrel.

Referring to FIG. 1, a block and flow diagram of a metal plating process is shown and illustrated for moving the barrels 20 and accompanying work loads along a flow path which includes a plurality of stations or tanks (1) through (18) as shown. The stations or tanks are shown by rectangles or blocks joined together along the tops thereof by arrowed paths of travel for the barrels 20 from one station or tank to another. A plurality of barrels 20 normally are utilized simultaneously throughout the process for efficiency purposes due to the fact that different times may be required within which a barrel and its accompanying work load may remain in various individual tanks along the process. A computerized carrying system including a hoist mechanism, described hereinafter, carries the barrels 20 along the process seriatim into and out of the various tanks shown and leaves the barrels bodily within the tanks depending upon the duration of time required to carry out the respective operation associated with each of the tanks along the process.

A barrel loading station (1) comprises a tank which contains deionized (DI) water. One of the barrels 20 is deposited in the tank and the barrel is loaded under water by an operator with the specific work load to be metal plated by the process. The barrel 20 described above includes a door or hatch (not shown) through which the work load is placed within the barrel. The loading operation is performed under water so as to minimize any damage to the work load which might result by simply dropping the work load through the air into an empty barrel. The size of the work load depends upon the parameters of the system. In utilizing the size or model barrel referred to above, an exemplary work load which has been utilized with the process of the invention has included 70,000 small electrical contacts.

At this point it should be understood that a hoist mechanism, described hereinafter and shown partially in FIG. 3, is employed to deliver barrels seriatim to the load station or tank (1) where the barrel remains stationary within the tank for loading purposes. However, after a loaded barrel is engaged by the hoist mechanism, the barrel and accompanying work load begins to rotate automatically upon engagement with the hoist mechanism and continues to rotate substantially constantly along its path of travel illustrated in FIG. 1 and described in greater detail hereinafter. The path of travel is indicated by a unidirectionally arrowed line 28 extending entirely along the top of the various tanks or stations shown in FIG. 1. Oppositely arrowed lines 30 are shown in FIG. 1 to join the flow path line 28 with each of the tanks or stations after the barrel is loaded at a tank or station (1).

Each barrel 20 is moved from the loading tank to a soak-clean station or tank (2) which contains an alkaline cleaning solution. This alkaline solution removes oils or other impurities from the work load, such as the electrical contacts.

While the barrels 20 are in the soak-clean tank (2), as well as each subsequent tank or station between the soak-clean tank and the unload station, described hereinafter, the barrels continue to rotate within the tanks by power source means, described hereinafter, coupled by appropriate terminal means at each tank to a drive motor for each barrel. The coupling of the power source to the barrels for rotation thereof will be described in greater detail hereinafter.

After a barrel 20 remains in the soak-clean tank (2) for a predetermined period of time, the barrel then is removed or carried to a rinse tank or station (3). The rinse tank (3) contains tap water from an original supply 34 thereof. In addition, an auxiliary supply 36 is provided and will be described hereinafter. With each of the supplies of tap water or other solutions at the various tanks described herein, appropriate float mechanisms or the like may be employed to maintain the level of water or other solution in the tanks substantially constant. The tap water within rinse tank (3) removes dirty alkaline cleaner which may remain on the work load and barrel after leaving the soak-clean tank (2).

The barrels 20 then are moved or carried from the rinse tank (3) to an electro-cleaning tank or station (4). An alkaline solution or cleaner again is utilized in tank (4), but D.C. electrolysis is utilized with the alkaline solution in tank (4) to remove, by deionization, any residual film such as oil, or oil that has been broken down by the alkaline solution, but which remains on the work load as a residue after the soak-clean tank (2).

The barrels 20 then are moved from the electro-cleaner tank (4) to a rinse tank (5) which contains tap water. Rinse tank (5) is one of a dual-cascade rinse tank assembly which includes a second rinse tank (6). The barrels are moved seriatim into and out of rinse tank (5) and then into rinse tank (6). Original tap water is supplied, as at 38, from a source thereof to rinse tank (6). The water from rinse tank (6) then overflows or cascades, as at 40, into rinse tank (5) and water from rinse tank (5) overflows into rinse tank (3), as indicated by the dotted arrowed line 36 described above. In this manner, there is a considerable savings of water by using this cascading or overflowing process.

The barrels 20 then are moved from rinse tank (6) to an acid-pickle tank or station (7). The acid-pickle tank is a final cleaning station prior to the metal plating or gold flashing step described hereinafter. The solution contained in the acid-pickle tank comprises a muriatic acid solution which can be made from a dry powder. It has been found successful to leave the barrels 20 and their accompanying work load within the acid-pickle tank for approximately two minutes. The muriatic acid removes all oxides from the work load not previously removed. When utilizing a work load comprising electrical contacts, often times the contacts are fabricated of copper or copper alloy materials. The muriatic acid, in addition to removing the oxides, also activates the copper.

The barrels 20 then are moved from the acid-pickle tank (7) to the first of a dual-cascade rinse tank assembly. More particularly, a first rinse tank (8) is provided and receives overflow or cascading water, as at 42, from a second rinse tank (9). Original DI water is supplied to rinse tank (9), as at 44.

After the barrels 20 are finally rinsed in rinse tank (9) preparatory to plating, the barrels are moved to a metal plating or gold flashing tank (10). "Flashing" simply is a term of art denoting a plating thickness in the 10 micro-inches range. It should be noted that in FIG. 1 the gold flash tank has a series of suffixes (a) through (d) to represent a plurality of tanks at the metal plating station. A plurality of tanks preferably are utilized to expedite the process of the present invention because normally the gold plating operation extends over a longer period of time than any single one of the other operations taking place in the various tanks or stations previously described or described hereinafter. In this manner, a more efficient or faster total continuous processing of the work load within barrels 20 can take place without any single operation either before or after the metal plating operation having to be delayed pending completion of the metal plating step.

The metal or gold plating operation at the "gold flash" tank comprises a pulse plating operation on the work load at the metal plating station (10). As stated above, there may be a series of gold flash tanks (10) (a) through (d). The pulse plating operation takes place in a chemical bath while rotating the work load within the bath and controlling the chemistry of the bath including the gold concentration, controlling the rotation of the work load, and controlling the duty cycle of the pulse plating apparatus. A commercially available pulse plating machine can be used. More particularly the Baume of the chemical bath in the tank at the pulse plating station is controlled on the order of 15°-17° specific gravity. The gold concentration of the chemical bath is on the order of 0.3-0.4 troy ounce gold per gallon of solution. The temperature of the chemical bath is on the order of 90°-95° Fahrenheit. The current density in the chemical bath is on the order of one ampere per square foot of work load area to be plated. The duty cycle of the pulse plating operation is on the order of one microsecond on and two micro-seconds off. The work load within the chemical bath is rotated at a speed of 9 or 10 revolutions per minute. As set forth in greater detail herein, this relatively fast rpm of the work load and the barrel 20 is made possible by the unique means disclosed herein for reducing the rate of rotation of the barrel and work load while being transported in air from station to station along the process. Should the work load and barrel be rotated in air at the relatively fast 9-10 rpm speed which facilitates the excellant plating afforded by the process of the present invention, the work load, such as small and fragile electrical contacts, would become damaged or deformed as they tumble within the barrels.

By utilizing the above parameters at the pulse-plating station, the gold thickness which is produced on the work load is extremely uniform and consistent with remarkably little deviation from the desired surface thichness. The parameters contribute to the production of a close tolerance plating thickness and the even distribution of the work load within the barrels described above, coupled with the rotational control of the barrels in and out of solution, provides both maintenance of level loads in the barrels as well as optimum rotational exchange of solution within the barrels. These parameters are quite unique in the gold plating industry.

As stated above, one typical work load has included 70,000 small electrical contacts which result in approximately 60 square feet of surface area which must be plated during the plating process. With such a work load, it has been found that an extremely tight curve of number of contacts verses micro-inch plating thichnes is obtained and exemplifies the very small deviation in plating thicknesses afforded by the present invention.

After the barrels 20 and their accompanying work load have completed the pulse plating operation in the metal plating tank (10), the barrels are moved to the first tank (11) of a three-cascade rinse tank assembly. Rinse tank (11) is a first-step cascade rinse tank which contains a solution of deionized water. This deionized water solution removes any traces of gold phosphates and other organic or inorganic substances which remain on the work load or the barrels after the gold plating process. Normally there is approximately 0.04 oz. gold, in solution, remaining on the work load and on the respective barrel at this point after the gold plating process. This concentration is introduced into the deionized water solution in rinse tank (11) where the concentration is further reduced to approximately 0.004 oz./gallon in the solution of rinse tank (11).

The barrels 20 and accompanying work loads then are moved from rinse tank (11) to a second-step cascade rinse tank (12) where further removal of gold is accomplished whereby the gold concentration in rinse tank (12) is reduced to approximately 0.0004 oz./gallon.

The barrels 20 then are moved from rinse tank (12) to a third step cascade rinse tank (13) where the gold concentration, in solution, of the deionized water is reduced to practically an unmeasureable concentration. It should be noted in FIG. 1, at 46, that water condensate is added to rinse tank (13) from a gold recovery station or operation described hereinafter. In addition, the gold concentration solution at rinse tank (11) which, as aforesaid, is on the order of 0.04 oz./gallon, is removed from rinse tank (11), as at 48, and is channeled to the gold recovery station.

The barrels 20 and their accompanying work loads then are moved from the third cascade rinse tank (13) to a high purity rinse tank (14). Deionized water is added to the high purity rinse tank (14), as at 50. The high purity rinse tank is electrically operated by conductivity meter control means to approximately 200 K-ohm maximum. There is practically no detectable gold in solution within the high purity rinse tank (14). Although an overflow 52 is shown between the high purity rinse tank (14) into the third-step cascade rinse tank (13), the overflow actually amounts to displaced deionized water caused by the introduction of the barrels and accompanying work load into the tank.

The barrels 20 and accompanying work loads then are moved from the high purity rinse tank (14) to a hot rinse tank (15) which also is supplied with deionized water, as at 52. This supply of deionized water is heated by appropriate means for cleaning purposes and also brightens the gold plating on the work load. Deionized water overflows, by displacement from the barrels and work loads, from the hot rinse tank (15), as at 54, into the high purity rinse tank (14).

The barrels 20 and accompanying work loads then are moved from the hot rinse tank (15) to an unload station (16) which comprises a tank filled with DI water. As with the barrel load station (1), this tank provides for underwater unloading to prevent damage or deformation of the work load, such as small and delicate electrical contacts. The barrel load station (1) and the unload station (16) could comprise a single tank at which the barrels are loaded and unloaded by a single operator. This can be accomplished by programming the computerized hoist mechanism, described hereinafter, so that the barrel loading and unloading is synchronized with the movement of the barrels along the path of travel defined by lines 28 and 30, as described above. For instance, the various tanks or stations described above can be positioned in a continuous straight line as shown, or the unload station (16) actually can be the same as the first barrel load station or tank (1). The computerized hoist mechanism moves the barrels from the hot rinse tank (15) back to the barrel load tank (1) which then would comprise the barrel unload tank.

After the work load or electrical contacts are removed from the barrels 20, they are subjected to a wax-coating process, as indicated at (17), which is a known process. Wax-coating of the electrical contacts provides for lubricity for the contacts during assembly of the contacts in finished electrical connectors.

After the wax-coating process (17), the operator then places the contacts in a low torque dryer (18). The low torque dryer is unique in that it utilizes a gradual starting mechanism in a centrifugal drying machine. More particularly, centrifugal or rotatable dryers for work loads is a known process, but it has been found that when drying small and somewhat fragile electrical contacts, deformation of the contacts is experienced. The known centrifugal dryers are heated and are started by an initial high torque starting mechanism whereby the high starting torque applied to the work load results in deformative forces on the contacts. With the low torque dryer (18), an eddy current control clutch drive motor 56 is coupled to the heating and starting mechanism of the centrifugal dryer and the eddy current control clutch mechanism is set to require 10–15 seconds to accelerate from zero to full revolutions per minute. This low load motor start-up process not only reduces deformative forces on the contacts, but also reduces the total energy requirement for the dryer.

A gold recovery station 58 is provided and employs a vacuum distillation process on the order of approximately 16–18 inches of mercury. The gold recovery station 58 receives the gold concentration solution from rinse tank (11) through conduit means 48 leading to the gold recovery station 58. As mentioned above, the gold concentration from rinse tank (11) is on the order of 0.04 oz. gold/gallon. The gold concentration is distilled by the vacuum distillation process at the gold recovery station 58 until the concentration is increased to on the order of 0.8 oz. gold/gallon. The specific gravity of this concentration is sensed by appropriate means to actuate a relay controlled valve and the concentrate can be carbon filtered and fed or dumped back into the gold plating solution in the gold platig tank (10). By utilizing a specific gravity sensing valve or the like, the concentrate (0.8 oz./gallon) is automatically dumped to be reused to replenish the gold solution in the gold plating tank (10). Due to the efficency of the post-plating rinsing process described above, a remarkable savings in gold is accomplished. Lastly, the distillate from the "still" at the gold recovery station 58 is returned to rinse tank (13) as previously indicated at 46.

Thus, it can be seen that the various recirculations of water, cascading of water and the return of condensate from the gold recovery station 58 to rinse tank (13) provides for a considerable savings in the amount of water and deionized water utilized in the process.

Referring back to FIG. 2, the triangularly shaped parabolic container or barrel 20 is rotatably mounted by means of a shaft 60 to a carrier or frame, generally designated 62 in FIG. 3. The container 20 and frame 62 move bodily together along the path of travel indicated by the lines 28 and 30 in FIG. 1 through the process described above. The frame 62 houses or mounts a self contained drive means for rotating the container 20 relative to the frame. The power means is shown by way of a circuit diagram in FIG. 4 and can be housed or mounted on the frame 62 by any appropriate means. One of the tanks shown in FIG. 1, namely the gold plating tank (10), is shown in FIG. 3 in section and partially fragmented and illustrates the liquid level 64 therein in relation to the rotatable container or barrel 20.

As stated above, the containers 20 are rotated at a slower rate of rotation while being carried through the air from one tank to another than while the containers are disposed within one of the solutions within one of the tanks, such as the plating tank (10) shown in FIG. 3. This is a unique feature of the invention and provides a means and method for preventing damage or deformation to the work load within the containers as the work load is tumbled about the interior of the containers while passing through air. By rotating the containers at a relatively slow rate of rotation in air, deformation of the work load, such as small or fragile electrical contacts, is vastly reduced. However, when the containers are deposited in one of the tanks which contain a particular solution, such as the gold plating solution in the gold plating tank (10), it is highly desirable to rotate the containers at a faster rate of rotation so as to enhance the gold plating operation or to facilitate the various cleaning and rinsing operations.

In order to provide for a differential speed of rotation of the containers 20 while in air verses while in a solution, a pair of horns 66a and 66b (FIGS. 3 and 4) are provided on the carrier or frame 62 on which the container 20 is rotatably mounted. Each of the horns 66a, 66b comprises a terminal for the electrical circuit shown in FIG. 1. Power to either one of these horns is provided from a power source 68 (FIG. 4) through terminal means mounted on a hoist mechanism for the containers and frames, as well as on the respective tanks along the process. The terminals on the hoist mechanism and the tanks will be described hereinafter.

Referring again to FIG. 4, the power source 68 is a low voltage input source on the order of 24 volts A. C. The horns 66a, 66b are coupled to a transformer, generally designated 70, which steps up the voltage to on the order of 110 volts A. C. The transformer 70 is coupled to a power pack 72 which comprises a power converter which rectifies the input voltage from the transformer 70 and converts the voltage to a D. C. output. The power pack 72 is coupled to a relay 74 which includes a switch 76 and a coil 78. The switch 76 is coupled to a variable potentiometer, generally designated 78. A motor 80 is coupled between the variable potentiometer 78 and the power pack or converter 72. A high side 78a of the variable potentiometer is connected to one side 76a of switch 76 to effect rotation of the containers 20 at a rate on the order of 9-10 rmp. A low side 78b of the variable potentiometer 78 is connected to the other or lower side 76a of the switch 76 to effect rotation of the containers 20 at a rate on the order of 1 ½-2 rmp. The coil 78 for switch 76 is coupled at one end thereof to horn or terminal 66b and the other end thereof to horn 66a through a proximity switch 82.

With the above circuit, it can be seen that regardless of which horn 66a, 66b is being provided with the low voltage from power source 68, the motor 80 will be driven at a rate of speed depending upon the position of swtich 76 within relay 74. The motor 80 is mounted on the carrier or frame 62 by any appropriate means and connected by appropriate means to the drive shaft 60 of the container 20.

FIG. 4 shows the switch 76 in position to be coupled to the high side 78a of the variable potentiometer 78 so as to drive the motor 80 at a given high rate of speed so as to rotate the container 20 at a rate of rotation on the order of 9-10 rpm. By closing the proximity switch 82, the relay coil 78 will be energized to cause the switch 76 to move to the low side 76b thereof which is coupled to the low side 78b of the potentiometer 78. This will cause the motor 80 to run at a slower rate or speed to rotate the container 20 at a rate of rotation on the order of 1½-2 rpm.

All of the circuit components described above including the container horns 66a, 66b, the transformer 70, the power pack 72, the relay 74, the variable potentiometer 78, the motor 80 and the proximity switch 82 are mounted by appropriate means on the carrier or frame 62 (FIG. 3) for the container 20. Thus, each carrier and container has its own self contained power means. As mentioned above, the horns 66a, 66b are shown on the carrier or frame 62 in FIG. 3. The only other component of the power means of FIG. 4 which is shown in FIG. 3 is the proximity switch 82, so indicated. The remaining components of the power means have been deleted from FIG. 3 so as not to detract from the structural surroundings of the horns 66a, 66b.

Each of the tanks (2) through (15) shown in FIG. 1 along the process of the present invention includes a saddle-like terminal 84 (FIG. 3) on the inside thereof above the liquid level 64 within the respective tank. This saddle-like terminal 84 is shown by an arrow in FIG. 4 and is connected by appropriate means (not shown in FIG. 3) to the low voltage power source 68. Likewise, a hoist mechanism, generally designated 86 and partially shown in FIG. 3, is provided to move the containers 20 along the path of travel indicated by the lines 28 and 30 in FIG. 1. Only a portion of the hoist mechanism 86 is shown in FIG. 3, but it will be understood that various hoist mechanisms may be employed and be powered by a programmed motorized mechanism, referred to above. However, the hoist mechanism 86 includes a saddle-like terminal 88 for engaging the terminal horn 66b on the frame 62 for the container 20. The saddle-like terminal 88 is similar to the terminal 84 for the tank (10) shown in FIG. 3 and may be connected by appropriate means to the low voltage power source 68. The terminal 88 is shown by an arrow in FIG. 4 connected to power source 68 and the connecting means can comprise any appropriate means such as a flexible electrical cable or the like.

Thus, it can be seen from FIG. 3 that power is supplied from the low voltage power source 68 (FIG. 4) to the terminal horns 66a, 66b by means of saddle-like terminals 84 and 88 mounted respectively on the various tanks (2) through (15) as well as on the hoist mechanism 86.

In order to actuate the proximity switch 82 when the hoist mechanism 86 and its terminal 88 engages the terminal horn 66b, and thereby reduce the rate of rotation of the container 20, a magnetic actuator 90 is provided on the hoist mechanism 86 and is so located as to be in proximity with the proximity switch 82 when the hoist terminal 88 is in position for engaging the carrier terminal 66b. The actuator 90 includes magnetic means such as a permanent magnet 92 which is effective when in close proximity to switch 82 on the carrier frame 62 to close the switch 82 and thereby reduce the speed of the motor 80, as described above, the motor being operatively connected to the drive shaft 60 of the container 20.

It should be pointed out that neither of the terminal horns 66a, 66b are shown in FIG. 3 to be in engagement with either of the terminals 84 or 88 on the tank (10) or the hoist mechanism 86, respectively. Although this would be an unrealistic situation, the illustrated positional relationships are so shown to better illustrate the horn terminal positions and saddle terminal positions in vertical alignment. The hoist mechanism 86 can move upwardly in the direction of arrow A (FIG. 3) to engage the horn terminal 66b, which is a solid conductive member, and lift the carrier or frame 62 and the accompanying container 20 out of the tank (10) and thereby lift the horn terminal 66a out of engagement with the saddle terminal 84 on the inside of the tank (10). Thus, the transition between the high rate of rotation of the container 20 within a respective tank to a low rate of rotation in air, would take place and continue as the container moves through air, thereby to prevent damage to the work load which continuously tumbles within the container as it moves from tank to tank or station to station along the process described above in relation to FIG. 1. The slow rate of rotation in air facilitates the various solutions to drain from the work load and barrels above the respective tanks. The hoist mechanism may easily be programmed to pause in air above the respective tanks to permit substantial draining.

While there has been described what is at present considered to be the preferred embodiment of the invention, it will be understood that various modifications may be made therein, and it is intended to cover in the appended claims all such modifications as fall within the true spirit and scope of the invention.

We claim:

1. In a method for metal plating a work load which is carried generally in a path of travel from a pre-plating treatment tank or the like, through air into and out of a plating tank, and from said plating tank to a post-plating treatment tank or the like, and in which said work load is rotatable during its travel along said path, the improvement comprising the steps of rotating said work load at a first rate of rotation while in said plating tank, and rotating said work load at a varying rate of rotation while in air when the work load is removed from said plating tank.

2. The method of claim 1 wherein said work load is rotated at a faster rate of rotation while in said plating tank than when removed therefrom.

3. The method of claim 1 where said work load is carried in a tumbler-type container or the like, and wherein said container is rotated at said varying rates of rotation while moving along said path of travel.

4. The method of claim 3 wherein said container is rotated at a faster rate of rotation while in said plating tank than while at another point along said path of travel outside of said plating tank.

5. The method of claim 1 wherein said container is rotated at a slower rate of rotation while traveling through air than while in said plating tank so as to reduce damage to said work load while tumbling within said container traveling through air.

6. In a method for metal plating a work load which is rotatably carried through air into and out of a metal plating tank, the improvement comprising the step of rotating said work load at a first rate of rotation while in said plating tank during a plating operation and a second rate of rotation while in air.

7. The method of claim 6 wherein said work load is rotated at a faster rate of rotation while in said plating tank than while in air.

8. The method of claim 6 wherein said work load is carried in a tumbler-type container or the like, and said container is rotated at said different rates of rotation.

9. The method of claim 8 wherein said container is rotated at a slower rate of rotation while in air than while in said plating tank so as to reduce damage to said work load while tumbling within said container traveling through air.

10. A method for gold plating a work load carried in a container through air from station to station along a path of travel between said stations, comprising the steps of:
    loading said work load into said container at a loading station;
    cleaning said work load with an alkaline solution or the like to remove organic or other impurities from said work load;
    rinsing said work load to remove residue alkaline solution and broken down impurities from said work load;
    cleaning said work load with an acid solution or the like to remove oxides and other materials from said work load;
    rinsing said work load to remove residue acid solution and broken down oxides and other materials from said work load;
    pulse plating said work load at a gold plating station in a chemical bath while rotating the work load within the bath, and controlling the rotation of the work load within the bath so as to provide a first rate of rotation while said work load is in the bath and a second rate of rotation while in air when the work load is removed from the bath, while controlling the chemistry of the bath including gold concentration and the duty cycle of the pulse-plating operation;
    rinsing said work load to remove residue gold from said work load; and
    unloading said work load from said container at an unloading station.

11. The method of claim 10 wherein said work load is loaded into said container at said loading station under a liquid solution in a reservoir thereof so as to reduce damage to the work load during loading.

12. The method of claim 10 wherein said work load is unloaded from said container at said unloading station under a liquid solution in a reservoir thereof so as to reduce damage to the work load during unloading.

13. The method of claim 10 wherein said rinse step after said electro-cleaning step includes rinsing said work load seriatim in a plurality of cascade-type rinsing tanks wherein the rinse solution from a last tank in a series thereof overflows into a previous tank.

14. The method of claim 10 including electro-cleaning said work load in an alkaline solution after said first alkaline cleaning step, said electro-cleaning including the application of electrolysis to the alkaline solution to remove by deionization any residue film and broken down impurities remaining on said work load after said first alkaline cleaning step.

15. The method of claim 14 including the step of rinsing said work load after said second alkaline cleaning step to remove residue alkaline solution and broken down impurities from said work load.

16. The method of claim 15 wherein said last named rinsing step includes rinsing said work load seriatim in a plurality of cascade-type rinsing tanks wherein the rinse solution from a last tank in a series thereof overflows into a previous tank.

17. The method of claim 10 wherein said rinse step after said acid cleaning step includes rinsing said work load seriatim in a plurality of cascade-type rinse tanks wherein the rinse solution from a last tank in a series thereof overflows into a previous tank.

18. The method of claim 10 wherein said acid cleaning step includes cleaning said work load in a muriatic acid solution or the like.

19. The method of claim 10 wherein said rinse step after said pulse plating step includes rinsing said work load seriatim in a plurality of cascade-type rinse tanks wherein the rinse solution from a last tank in a series thereof overflows into a previous tank.

20. The method of claim 19 wherein solution from the first of said cascade-type rinse tanks is fed to a recovery station where gold residue from said solution is recovered therefrom.

21. The method of claim 20 wherein the gold recovered at said recovery station is fed back into the chemical bath at said gold plating station.

22. The method of claim 20 wherein said gold is recovered at said recovery station by a vacuum distillation process and the distillate therefrom is returned to the solution in one of said cascade-type rinse tanks.

23. The method of claim 10 wherein said work load is rinsed after said pulse plating step by utilizing deionized water.

24. The method of claim 10 including the step of rinsing said work load after said first rinse step after said plating operation in a hot rinse bath to brighten the gold plating on said work load.

25. The method of claim 24 wherein deionized water is utilized in said hot rinse step.

26. The method of claim 10 including the step of rinsing said work load after said pulse plating operation in an electro-cleaning bath.

27. The method of claim 26 wherein said electro-cleaning bath comprises deionized water.

28. The method of claim 10 wherein said work load comprises electrical contacts or the like and including the step of wax coating the electrical contacts after removal from said container at said unloading station to provide lubricity therefor.

29. The method of claim 10 including the step of drying said work load in a low torque centrifugal dryer having a gradual start-up speed from zero to full rpm.

30. The method of claim 10 wherein the Baumé of the chemical bath at said pulse plating station is on the order of 15°–17°.

31. The method of claim 10 wherein the pH of the chemical bath at said pulse plating station is on the order of 3.7 or 3.8.

32. The method of claim 31 the method of claim 26 wherein the Baumé of the chemical bath at said pulse plating station is on the order of 15°–17°.

33. The method of claim 10 wherein the gold concentration of the chemical bath at said pulse plating station is on the order of 0.3 to 0.4 troy ounce gold per gallon of solution.

34. The method of claim 10 wherein the temperature of the chemical bath at said pulse plating station is on the order of 90°–95° F.

35. The method of claim 10 wherein the current density in the chemical bath at said pulse plating station is on the order of one ampere per square foot of work load to be plated.

36. The method of claim 35 wherein the duty cycle of said pulse plating operation is on the order of one micro-second on and two micro-seconds off.

37. The method of claim 10 wherein the rpm of said work load within the chemical bath at said pulse plating station is on the order of nine or ten rpm.

38. A method for gold plating a work load carried in a container from station to station along a path of travel between said stations, comprising the steps of:
loading said work load into said container at a loading station;
cleaning said work load with an alkaline solution or the like to remove organic or other impurities from said work load;
rinsing said work load to remove residue alkaline solution and broken down impurities from said work load;
cleaning said work load with an acid solution or the like to remove oxides and other materials from said work load;
rinsing said work load to remove residue acid solution and broken down oxides and other materials from said work load;
pulse plating said work load at a gold plating station in a chemical bath while rotating the work load within the bath, and controlling the rotation of the work load within the bath, the chemistry of the bath including gold concentration, and the duty cycle of the pulse-plating operation, wherein the Baumé of the chemical bath at said pulse plating station is on the order of 15°–17°, the pH of the chemical bath at said pulse plating station is on the order of 3.7 or 3.8 gram equivalents per liter, the gold concentration of the chemical bath at said pulse plating station is on the order of 0.3 to 0.4 troy ounce gold per gallon of solution, the duty cycle of said pulse plating operation is on the order of one micro-second on and two micro-seconds off, the rpm of said work load within the chemical bath at said pulse plating station is on the order of nine or ten rmp;
rinsing said work load to remove residue gold from said work load; and
unloading said work load from said container at an unloading station.

39. The method of claim 38 wherein the temperature of the chemical bath at said pulse plating station is on the order of 90°–95° F.

40. The method of claim 38 wherein the current density in the chemical bath at said pulse plating station is on the order of one ampere per square foot of work load to be plated.

41. A method for gold plating a work load carried in a tumbler-type container from station to station along a path of travel between said stations, the container loosely receiving said work load, comprising the steps of:
loading said work load into said container at a loading station;
cleaning said work load with an alkaline solution or the like to remove organic or other impurities from said work load;
rinsing said work load to remove residue alkaline solution and broken down impurities from said work load;
cleaning said work load with an acid solution or the like to remove oxides and other materials from said work load;
rinsing said work load to remove residue acid solution and broken down oxides and other materials from said work load;
pulse plating said work load at a gold plating station in a chemical bath while rotating the work load within the bath, and controlling the rotation of the work load within the bath, the chemistry of the bath including gold concentration, and the duty cycle of the pulse-plating operation, said work load being moved through air into and out of said bath at said pulse-plating station, and controlling the rate of rotation of said container so that the container rotates at a slower rate of rotation in air than in said bath to preclude damaging said work load while tumbling within said container during movement thereof through air;
rinsing said work load to remove residue gold from said work load; and
unloading said work load from said container at an unloading station.

42. The method of claim 41 wherein said container is rotated in air at a rate of rotation on the order of one or two rpm while in air and on the order of nine or ten rmp while in said bath.

43. A method for gold plating a work load carried in a container from station to station along a path of travel between said stations, comprising the steps of:
loading said work load into said container;
cleaning said work load to remove impurities;
pulse plating said work load at a gold plating station in a chemical bath while rotating the work load within the bath, and controlling the rate of rotation of the work load within the the bath, the chemistry of the bath including the gold concentration, and the duty cycle of the pulse plating operation, wherein the Baumé of the chemical bath at said pulse plating station is on the order of 15°–17°, the pH of the chemical bath at said pulse plating station is on the order of 3.7 or 3.8, the gold concentration of the chemical bath at said pulse plating station is on the order of 0.3 to 0.4 troy ounce gold per gallon of solution, the duty cycle of said pulse plating operation is on the order of one micro-second on and two micro-seconds off, the rpm of said work load within the chemical bath at said pulse plating station is on the order of nine or ten rpm.

44. The method of claim 43 wherein the temperature of the chemical bath of said pulse plating station is on the order of 90°-95° F.

45. The method of claim 43 wherein the current density in the chemical bath at said pulse plating station is on the order of one ampere per square foot of work load to be plated.

46. The method of claim 43 wherein said container is a tumbler-type container for loosely receiving said work load and wherein said container and accompanying work load is moved through air into and out of said bath at said pulse plating station, and including the step of controlling the rate of rotation of said container so that the container rotates at a slower rate of rotation in air than in said bath to preclude damaging said work load while tumbling within said container during movement thereof through air.

47. The method of claim 43 including the step of rinsing said work load after said pulse plating operation to remove residue gold from said work load.

48. The method of claim 47 wherein said rinsing step includes rinsing said work load seriatim in a plurality of cascade-type rinsing tanks wherein the rinse solution from a last tank in a series thereof overflows into a previous tank.

49. The method of claim 48 wherein solution from said rinsing step is fed to a recovery station where gold residue from said solution is recovered therefrom.

50. The method of claim 49 wherein the gold recovered at said recovery station is fed back into the chemical bath at said gold plating station.

51. A method for gold plating a work load carried in a container from station to station along a path of travel between said stations, comprising the steps of:
    loading said work load into said container;
    cleaning said work load to remove impurities;
    pulse plating said work load at a gold plating station in a chemical bath while rotating the work load within the bath, and controlling the rate of rotation of the work load within the bath, the chemistry of the bath including the gold concentration, and the duty cycle of the pulse plating operation, and wherein said container is a tumbler-type container for loosely receiving said work load and wherein said container, and accompanying work load, is moved through air into and out of the bath at said pulse plating station, and including the step of controlling the rate of rotation of said container so that the container rotates at a slower rate of rotation in air than in said bath to preclude damaging said work load while tumbling within said container during movement thereof through air.

* * * * *